(12) United States Patent
Vogman

(10) Patent No.: US 9,523,721 B2
(45) Date of Patent: Dec. 20, 2016

(54) METHOD AND APPARATUS FOR PRECISION CPU MONITORING

(75) Inventor: Viktor D. Vogman, Olympia, WA (US)

(73) Assignee: INTEL CORPORATION, Santa Clara, CA (US)

(*) Notice: Subject to any disclaimer, the term of this patent is extended or adjusted under 35 U.S.C. 154(b) by 495 days.

(21) Appl. No.: 13/992,993

(22) PCT Filed: Dec. 15, 2011

(86) PCT No.: PCT/US2011/065211
§ 371 (c)(1),
(2), (4) Date: Jun. 10, 2013

(87) PCT Pub. No.: WO2013/089748
PCT Pub. Date: Jun. 20, 2013

(65) Prior Publication Data
US 2014/0218007 A1    Aug. 7, 2014

(51) Int. Cl.
*G01R 19/00* (2006.01)
*G06F 11/30* (2006.01)
(Continued)

(52) U.S. Cl.
CPC ............. *G01R 19/0092* (2013.01); *G06F 1/26* (2013.01); *G06F 11/3024* (2013.01);
(Continued)

(58) Field of Classification Search
CPC ..... G01R 19/0092; G01R 31/40; G01R 31/42; G01R 19/0023; G01R 19/003; G01R 19/00; G01R 1/20; G01R 31/3613; G01R 33/1207; G01R 15/142; G01R 15/16; G01R 15/18
See application file for complete search history.

(56) References Cited

U.S. PATENT DOCUMENTS 7,233,132 B1 * 6/2007 Dong .................. H02M 3/1584
323/272
8,013,580 B2    9/2011 Cervera et al.
(Continued)

FOREIGN PATENT DOCUMENTS

CN           1265479 A      9/2000

OTHER PUBLICATIONS

"Notice of First Office Action" dated Dec. 4, 2015 from the Chinese Patent Office, along with unofficial English translation, 11 pp.
(Continued)

*Primary Examiner* — Tung X Nguyen
(74) *Attorney, Agent, or Firm* — Buckley, Maschoff & Talwalkar LLC

(57) ABSTRACT

Example embodiments of a processor current monitor include a switching voltage regulator including a series-connected LC filter including a first inductor, with the first inductor having an inductance value of L1, a first terminal coupled to a switch and a second terminal coupled to a first node, and with the LC filter further including a first capacitor, with the first capacitor having a capacitance value of C1, a first terminal coupled to the first node and a second terminal coupled to a second node, where the switch is configured to couple the inductor to an input voltage at a selected frequency and with the switching voltage regulator configured to supply an output current from the first node to a processor, an inductor current monitoring element 729, coupled to the first inductor, configured to output a first signal indicating the magnitude of current flowing through the first inductor, a capacitor current monitoring element 719, coupled to the first capacitor, configured to output a second signal indicating the magnitude of current flowing through the first capacitor, and a summing element 741, coupled to receive the first and second signals, configured to
(Continued)

output a current monitor signal indicating the sum of the first and second signals and with the current monitor signal indicating the magnitude of the output current.

16 Claims, 7 Drawing Sheets

(51) Int. Cl.
  *G06F 1/26* (2006.01)
  *H02M 3/158* (2006.01)
  *H02M 1/00* (2006.01)

(52) U.S. Cl.
  CPC ....... *G06F 11/3058* (2013.01); *H02M 3/1588* (2013.01); *H02M 2001/0009* (2013.01); *Y02B 70/1466* (2013.01)

(56) References Cited

U.S. PATENT DOCUMENTS

| | | | |
|---|---|---|---|
| 8,120,346 B2* | 2/2012 | Ostrom | H02M 3/156 323/272 |
| 8,988,053 B2* | 3/2015 | Hsu | H02M 3/1584 323/272 |
| 2007/0257649 A1 | 11/2007 | Burton et al. | |
| 2009/0045791 A1 | 2/2009 | Feng et al. | |
| 2011/0181253 A1 | 7/2011 | Isham et al. | |
| 2011/0235371 A1 | 9/2011 | Liang | |

OTHER PUBLICATIONS

"PCT Notification of Transmittal of the International Search Report and the Written Opinion of the International Searching Authority, or the Declaration", dated Aug. 27, 2012, for International Application No. PCT/US2011/065211, 9pgs.
"Notification Concerning Transmittal of International Preliminary Report on Patentability Chapter 1 of the Patent Cooperation Treaty", Jun. 26, 2014, for International Application No. PCT/US2011/065211, 6pgs.
"English Translation of German Office Action", for German Patent Application No. 112011105947.7, completed Mar. 31, 2016, 3 pp.
German Office Action for German Patent Application No. 112011105947.7, completed Mar. 31, 2016, 6 pp.

* cited by examiner

METHOD AND APPARATUS FOR PRECISION CPU MONITORING

BACKGROUND OF THE INVENTION

The example embodiments described below relate generally to sensing the current provided by a switching voltage regulator.

Server farms using high-end processors can place large demands on power and cooling resources. Server system control facilities monitor power consumption and in a dynamic mode processors are switched between different performance states to conserve power. Processor power consumption is determined by measuring the processor current.

Voltage regulator (VR) designs incorporate s simple current sensing technique that utilizes the VR inductor series parasitic resistance ($R_L$). The current through the inductor of the VR is practically equal to the processor current when processor current is constant and this technique provides acceptable accuracy during static mode. However, in dynamic mode monitoring inductor current instead of actual processor current does not provide acceptable results because, while the processor current value changes rapidly and spans a wide range, the current through the VR inductor changes slowly due to LC-filtering effects on the inductor current signal. As a result, in dynamic mode the technique of representing actual processor current by VR inductor current produces errors in both timing and current magnitude monitoring.

A DC-to-DC voltage regulator typically is used to convert a DC input voltage to either a higher or a lower DC output voltage. One type of voltage regulator is a switching regulator that is often chosen due to its small size and efficiency. The switching regulator typically includes one or more switches that are rapidly opened and closed to transfer energy between an inductor (a stand-alone inductor or a transformer, as examples) and an input voltage source in a manner that regulates the output voltage.

As an example, referring to FIG. 1, one type of switching regulator is a Buck switching regulator 10 that receives an input DC voltage (called $V_{IN}$) and converts the $V_{IN}$ voltage to a lower regulated output voltage (called $V_{OUT}$) that appears at an output terminal 11. To accomplish this, the regulator 10 may include a switch 20 (a metal-oxide-semiconductor field-effect-transistor (MOSFET), for example) that is operated (via a switch control signal called $V_{SW}$) in a manner to regulate the $V_{OUT}$ voltage, as described below.

Referring also FIGS. 2 and 3, in particular, the switch 20 opens and closes to control energization/de-energization cycles 19 (each having a duration called $T_S$) of an inductor 14. In each cycle 19, the regulator 10 asserts, (drives high, for example) the $V_{SW}$ signal during an on interval (called $T_{ON}$) to close the switch 20 and transfer energy from an input voltage source 9 to the inductor 14. During the $T_{ON}$ interval, a current (called $I_L$) of the inductor 14 has a positive slope. During an off interval (called $T_{OFF}$) of the cycle 19, the regulator 10 deasserts (drives low, for example) the $V_{SW}$ voltage to open the switch 20 and isolate the input voltage source 9 from the inductor 14. At this point, the level of the $I_L$ current is not abruptly halted, but rather, a diode 18 begins conducting to transfer energy from the inductor 14 to a bulk capacitor 16 and a load (not shown) that are coupled to the output terminal 11. During the $T_{OFF}$ interval, the $I_L$ current has a negative slope, and the regulator 10 may close a switch 21 to shunt the diode 18 to reduce the amount of power that is otherwise dissipated by the diode 18. The bulk capacitor 16 serves as a stored energy source that is depleted by the load, and additional energy is transferred from the inductor 14 to the bulk capacitor 16 during each $T_{ON}$ interval.

For the Buck switching regulator, the ratio of the $T_{ON}$ interval to the $T_S$ interval (i.e., the summation of the $T_{ON}$ and $T_{OFF}$ intervals) is called a duty cycle of the regulator and generally governs the ratio of the $V_{OUT}$ voltage to the $V_{IN}$ voltage. Thus, to increase the $V_{OUT}$ voltage, the duty cycle of the regulator may be increased, and to decrease the $V_{OUT}$ voltage, the duty cycle may be decreased.

As an example, the regulator 10 may include a controller 15 (see FIG. 1) that regulates the $V_{OUT}$ voltage by using a current mode control technique. In this manner, the controller 15 may include an error amplifier 23 that amplifies the difference between a reference voltage (called $V_{REF}$) and a voltage (called $V_P$ (see FIG. 1)) that is proportional to the $V_{OUT}$ voltage to produce an error voltage (called $V_{CNTRL}$) that is used to control the levels of the $V_{OUT}$ voltage and the $I_L$ inductor current.

The controller 15 uses the $V_{CNTRL}$ voltage and a voltage (called $V_{CS}$) that indicates the $I_L$ inductor current to produce the $V_{SW}$ switch control signal to control the switch 20. More specifically, referring also to FIG. 5, the controller 15 may include a comparator 26 that compares the $V_{CNTRL}$ and $V_{CS}$ voltages. The $V_{CS}$ voltage is provided by a differential amplifier 24 that senses the voltage difference (called $V_R$) across a current sensing resistor 29 that is coupled in series with the inductor 14.

The output terminal of the comparator 26 may be coupled to a switch circuit 27 that generates the $V_{SW}$ switch control signal. As an example of one type of current mode control, the switch circuit 27 may keep the $T_{OFF}$ time interval constant and use the positive incline of the $V_{CS}$ voltage to control the duration of the $T_{ON}$ time interval. Thus, the $T_{ON}$ time interval ends when the $V_{CS}$ voltage reaches the $V_{CNTRL}$ voltage and begins at the expiration of the constant $T_{OFF}$ interval.

Due to the above-described arrangement, when the $V_{OUT}$ voltage increases, the $V_{CNTRL}$ voltage decreases and causes the duty cycle of the regulator 10 to decrease to counteract the increase in $V_{OUT}$. Conversely, when the $V_{OUT}$ voltage decreases, the $V_{CNTRL}$ voltage increases and causes the duty cycle to increase to counteract the decrease in $V_{OUT}$. When the average value, or DC component, of the $I_L$ current increases, the DC component of the $V_{CS}$ voltage increases and causes the duty cycle to decrease to counteract the increase in the $I_L$ current. Conversely, when DC component of the $I_L$ current decreases, the DC component of the $V_{CS}$ voltage decreases and causes the duty cycle to increase to counteract the decrease in the $I_L$ current. The switching frequency (i.e., $1/T_S$) typically controls the magnitude of an AC ripple component (called $V_{RIPPLE}$ (see FIG. 4)) of the $V_{OUT}$ voltage, as a higher switching frequency typically reduces the magnitude of the $V_{RIPPLE}$ voltage.

Accurate monitoring of High-end processors current provides precise information about power consumption, which allows for optimal server system control and results in the best data center performance. The faster and the more accurate the current-sensing circuit is, the better the processor and server platform performance.

To monitor CPU current (power), present Voltage Regulator (VR) designs incorporate a simple current-sensing technique that utilizes the VR inductor series parasitic resistance, R L. When processor current is constant, the current through the inductor Is practically equal to the CPU current and this technique provides acceptable accuracy.

However, in dynamic mode, sensing the inductor current instead of the actual CPU current has one major disadvantage: while the CPU current value changes rapidly and spans a wide range, current through the inductor changes slowly due to LC-filtering effect on the current signal. Consequently, in dynamic mode this technique produces errors in both timing and current magnitude monitoring.

DETAILED DESCRIPTION OF EXAMPLE EMBODIMENTS

Reference will now be made in detail to various embodiments of the invention. Examples of these embodiments are illustrated in the accompanying drawings. While the invention will be described in conjunction with these embodiments, it will be understood that it is not intended to limit the invention to any embodiment. On the contrary, it is intended to cover alternatives, modifications, and equivalents as may be included within the spirit and scope of the invention as defined by the appended claims. In the following description, numerous specific details are set forth in order to provide a thorough understanding of the various embodiments. However, the present invention may be practiced without some or all of these specific details. In other instances, well known process operations have not been described in detail in order not to unnecessarily obscure the present invention. Further, each appearance of the phrase an "example embodiment" at various places in the specification does not necessarily refer to the same example embodiment.

Figure 1:
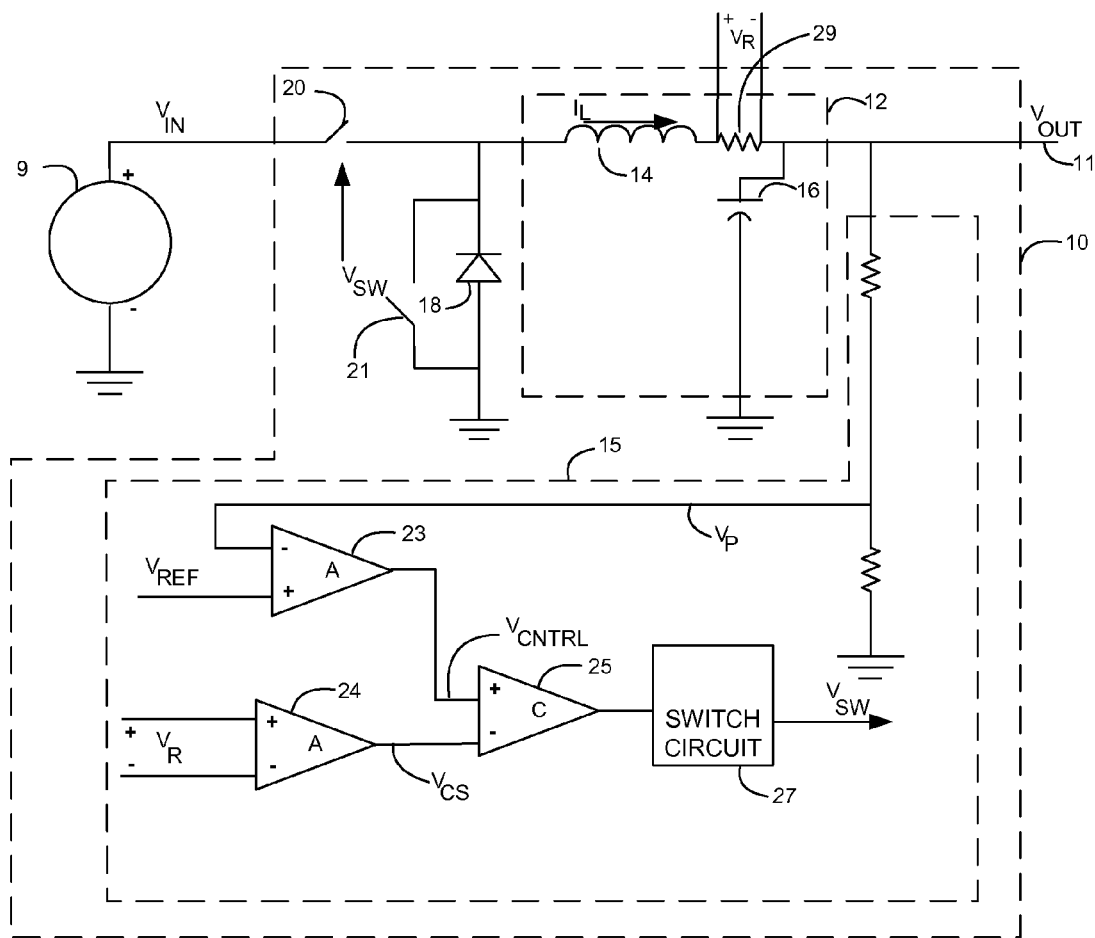
FIG. 1 is a schematic diagram of a switching voltage regulator of the prior art.
Figures 2, 3, 4, 5:
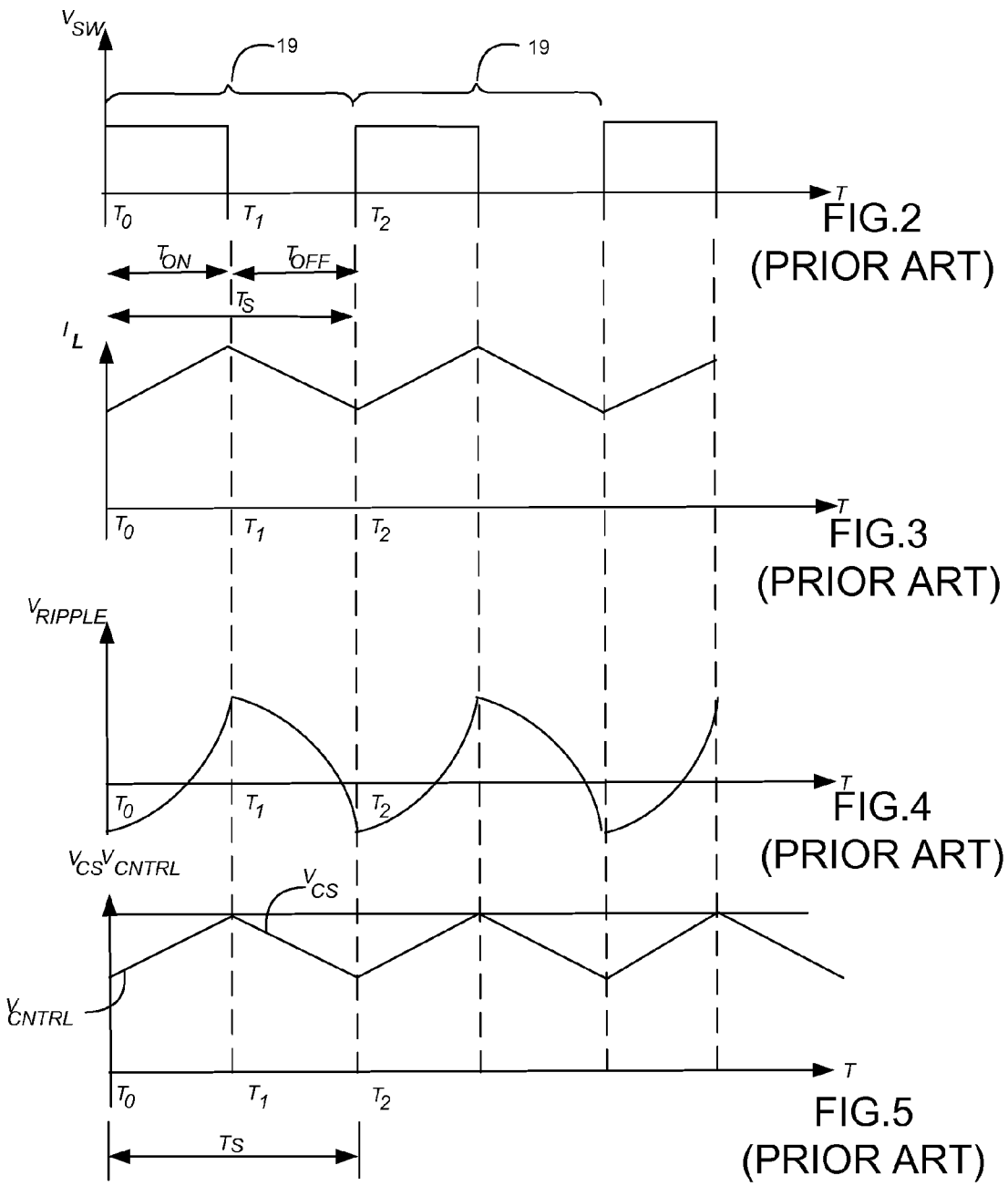
FIGS. 2, 3, 4 and 5 are waveforms that illustrate operation of the regulator of FIG. 1.
Figure 6:
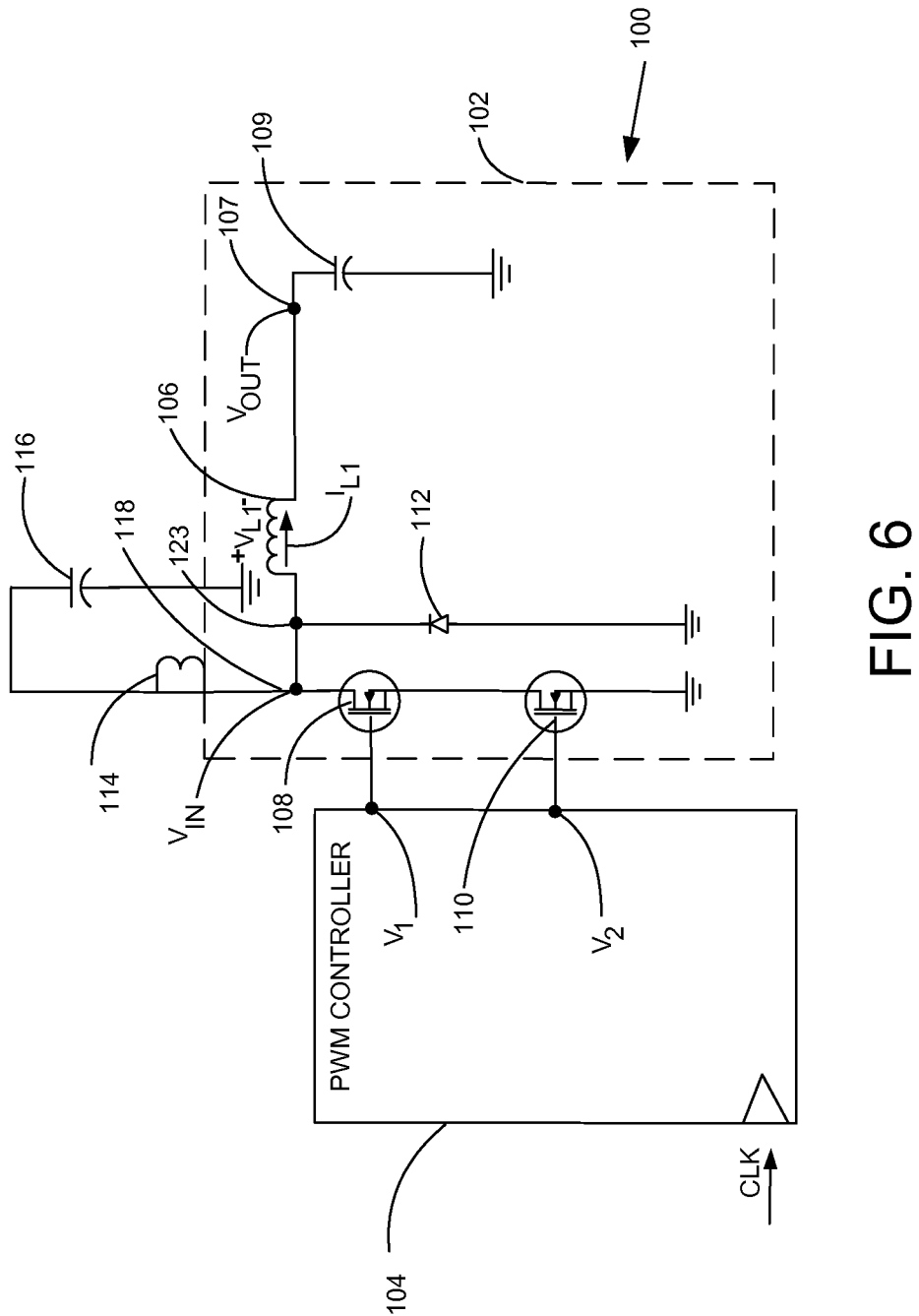
FIG. 6 is a schematic diagram of a voltage regulation system utilized in example embodiment.

Referring to FIG. 6, an embodiment of a voltage regulation system 100 utilized in example embodiment includes a Buck switching regulator that converts an input voltage (called $V_{IN}$) into an output voltage (called $V_{OUT}$). The regulator receives the $V_{IN}$ input voltage and regulates the $V_{OUT}$ voltage that appears at an output terminal 107 (of the system 100). The $V_{IN}$ voltage may be provided by a voltage regulator that receives an AC wall voltage, for example and produces a DC voltage that is filtered by a low pass filter (formed by an inductor 114 and a capacitor 116) to form the $V_{IN}$ input voltage. A bulk capacitor 109 is coupled between the output terminal 107 and ground. As described below, the system 100 also includes a pulse width modulation (PWM) controller 104 that uses a current mode technique to control the operation of the switching regulator 102.

In this example, the switching regulator 102 includes a switch 108 (a metal-oxide-semiconductor field-effect-transistor (MOSFET), for example) that is coupled between the positive terminal of an input voltage line 118 (that provides the V.sub.IN input voltage) and a terminal 123 of an inductor 106 (of the switching regulator 102). The other terminal of the inductor 106 is coupled to the output terminal 107.

The closing of the switch 108 causes energy to be transferred from the input voltage line 118 and stored in the inductor 106 to energize the inductor 106, and the opening of the switch 108 causes the stored energy to be transferred from the inductor 106 to the output terminal 107, a transfer that de-energizes the inductor 106. In this manner, when the switch 108 is open, a diode 112 (that has its anode couple to ground and its cathode coupled to the terminal 123) conducts and/or a switch 110 (that is controlled via a switch control signal called V.sub.2 (for the stage 102.sub.1) or a switch control signal called V.sub.4 (for the stage 102.sub.2)) closes to couple the terminal 123 to ground to permit the flow of energy to the output terminal 107.

Figure 7:
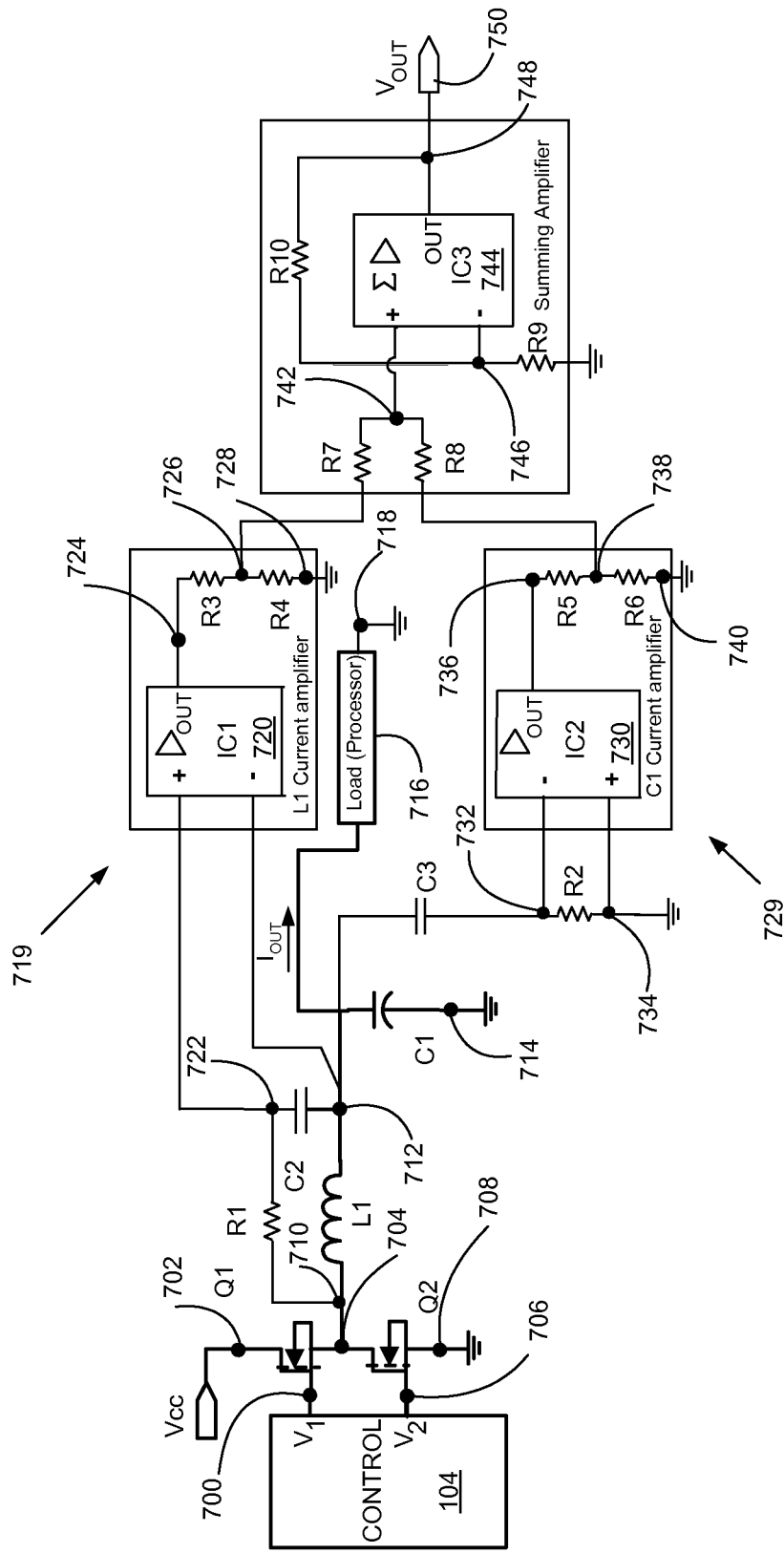
FIG. 7 is a schematic diagram on an example embodiment.

FIG. 7 depicts an example embodiment of a switched voltage regulator that outputs a CPU current monitoring signal that indicates the sum of the current flowing from the inductor and tank capacitor of the voltage regulator circuit depicted in FIG. 6. Elements in FIG. 7 that are the same or similar to like elements in FIG. 6 are indicated by the same reference numerals.

In FIG. 7, a PWM controller 104 includes V1 and V2 output ports. A first MOS switch Q1 has a gate terminal coupled to a first node 700, a drain terminal coupled to a second node 702 and a source terminal coupled to a third node 704. The first node 700 is coupled to V1 output of the controller 105 and the second node 702 is coupled to the input voltage VCC. A second MOS switch Q2 has a gate terminal coupled a fourth node 706, a drain terminal coupled to a third node 704 and a source terminal coupled to a fifth node 708. The fourth node 707 is coupled to the V2 output of the controller 105 and the fifth node 708 is coupled to ground.

An inductor L1 has a first terminal coupled to a sixth node 710 and a second terminal coupled to a seventh node 712 and a bulk capacitor C1 has a first terminal coupled to the seventh node 712 and a second terminal coupled to an eighth node 714. The sixth node 710 is coupled to the third node 704 and the eighth node 714 is coupled to ground. A processor 716, which is the load of the voltage regulator, has a first terminal coupled to the seventh node 712 and a second terminal coupled to a ninth node 718. The ninth node 718 is coupled to ground.

An inductor current monitoring circuit 719 that monitors the current flowing through the L1 includes resistor R1 capacitor C2, an L1 current amplifier 720 and voltage divider resistors R3 and R4. R1 has a first terminal coupled to the sixth node 710 and a second terminal coupled to a tenth node 722. C2 has a first terminal coupled to the seventh node 712 and a second terminal coupled to the tenth node 722. The L1 current amplifier 720 has a positive input coupled to the tenth node 722, a negative input coupled to the seventh node 712 and an output coupled to an eleventh node 724. R3 has a first terminal coupled to the eleventh node 724 and a second terminal coupled to a twelfth node 726. R4 has a first terminal coupled to the twelfth node 726 and a second terminal coupled to thirteenth node 728. The thirteenth node is coupled to ground.

A capacitor current monitoring circuit 729 that monitors current flowing through C1 includes capacitor C3, resistor R2, C1 current amplifier 730 and voltage divider resistors R5 and R6. C3 has a first terminal coupled to the seventh node 712 and a second terminal coupled to fourteenth node 732. R2 has a first terminal coupled to the fourteenth node 732 and a second terminal coupled to a fifteenth node 734. The C1 current amplifier 730 includes a negative input coupled to the fourteenth node 732, a positive input coupled to the fifteenth node 734 and an output terminal coupled to a sixteenth node 736. R5 has a first terminal coupled to the sixteenth node 736 and a second terminal coupled to a seventeenth node 740. R6 has first terminal coupled to the seventeenth node 738 and a second terminal coupled to an eighteenth node 740. The eighteenth node 740 is coupled to ground.

A current summing circuit 741 that adds the currents measured by the inductor current monitoring circuit 719 and capacitor current monitoring circuit 729 includes R7 having a first terminal coupled to the twelfth node 726 and a second terminal coupled to a nineteenth node 742, R8 having a first terminal coupled to the seventeenth node 738 and a second terminal coupled to the nineteenth node 742, and a summing amplifier having a plus input coupled to the nineteenth node 742, a minus input coupled to a twentieth node and an output coupled to a twenty-first node 748. R9 has a first terminal coupled to the twentieth node 746 and a second terminal coupled to ground and R10 has first terminal coupled to the twentieth node and a second terminal coupled to the twenty-first node 748. The twenty first node 748 is coupled to a $V_{OUT}$ pin 750.

The operation of an example of a conventional inductor current monitoring circuit, for example the inductor current monitoring 719, will now be described. As is known in the art, an inductor, such as inductor L1, is modeled as including an inductor equivalent series resistance ($R_L$). The series circuit including R1 and C2 is coupled to the sixth and seventh nodes 710 and 712. The time constant for this series circuit is equal to R1*C2. If the values of R1 and C2 are selected so that the value of R1*C2 is equal to the value of the inductor self time constant $L1/R_L$, then the voltage across C2 represents a signal proportional to the current flowing through the inductor L1 (which is proportional to the voltage drop across $R_L$).

This voltage drop across C2 is measured by the L1 current amplifier 720 and a signal indicating the amplitude of the voltage drop is output at the output terminal of the L1 current amplifier 720.

The operation of an example of the capacitor current monitoring circuit 729 will now be described. As is known in the art, a capacitor, such as capacitor C1, is modeled as including a capacitor equivalent series resistance ($R_C$). The series circuit including C3 and R2 is coupled the seventh and fifteenth nodes 712 and 734. The time constant for this series circuit is equal to R2*C3. As will be demonstrated below, if the values or R2 and C3 are selected so that the value of R2*C3 is selected to be equal to the value of the capacitor self time constant $C1*R_C$ then the voltage across the R2 represents a signal proportional to the current flowing through the capacitor C1.

If the voltage across the capacitor C1 in the s-domain is represented as $V_C(s)$, then the capacitor current, $I_{C1}(s)$, in the s-domain is represented as:

$$I_{c1}(s) = \frac{v_c(s)}{z_c(s)} = \frac{v_c(s)}{R_C + \frac{1}{sC_1}} = \frac{v_c(s)}{R_C\left(1 + \frac{1}{s*R_C*C_1}\right)} \quad \text{Equation (1)}$$

The voltage, $-V_C(s)$, across the output capacitor C1 and the series capacitive sensing circuit of C3 and R2 is the same because both are connected to the sixth and seventh nodes 710 and 712. Therefore the voltage across R2 in the s-domain is represented as:

$$V_{R2}(s) = \frac{v_c(s)*R_2}{z_{c2}(s)} = \frac{v_c(s)*R_2}{R_2 + \frac{1}{sC_3}} = \frac{v_c(s)}{\left(1 + \frac{1}{s*R_2*C_3}\right)} \quad \text{Equation (2)}$$

Therefore, if R2*C3 is equal to $C1*R_C$ then from equations (1) and (2) it follows that the voltage across the R2 is directly proportional to the current through the voltage regulator output capacitor C1, i.e., $V_R(s)=I_{C1}(s)*R_C$.

This voltage drop across R2 is measured by the C1 current amplifier 730 and a signal indicating the amplitude of the voltage drop is output at the output terminal of the C1 current amplifier 730.

In this example embodiment, the outputs of the C1 current amplifier 720 and the L1 current amplifies are added by the summing amplifier 744. The voltage dividers formed by R3, R4 and R5, R6 are used to bring the amplified signals to the same scale when, as in the general case, the equivalent series resistances of C1 and L1 are not equal. Alternatively, the same result can be achieved by setting the gains of the current signal amplifiers 720 and 730 in reverse proportion to the series resistance values, i.e., $G_C/G_L=R_L/R_C$, where $G_C$ and $G_L$ are the gains of the C1 current amplifier 730 and L1 current amplifier 720 respectively. The outputs of the voltage dividers are coupled to the summing amplifier 744 through buffer resistors R7 and R8.

The value of $I_{OUT}$, current supplied to the processor 716, is equal to the sum of the values of the currents flowing through L1 and C1 by Kirchoff's law. Accordingly, the value of the signal output by summing amplifier 744 represents a voltage directly proportional to $I_{OUT}$.

Figure 8:
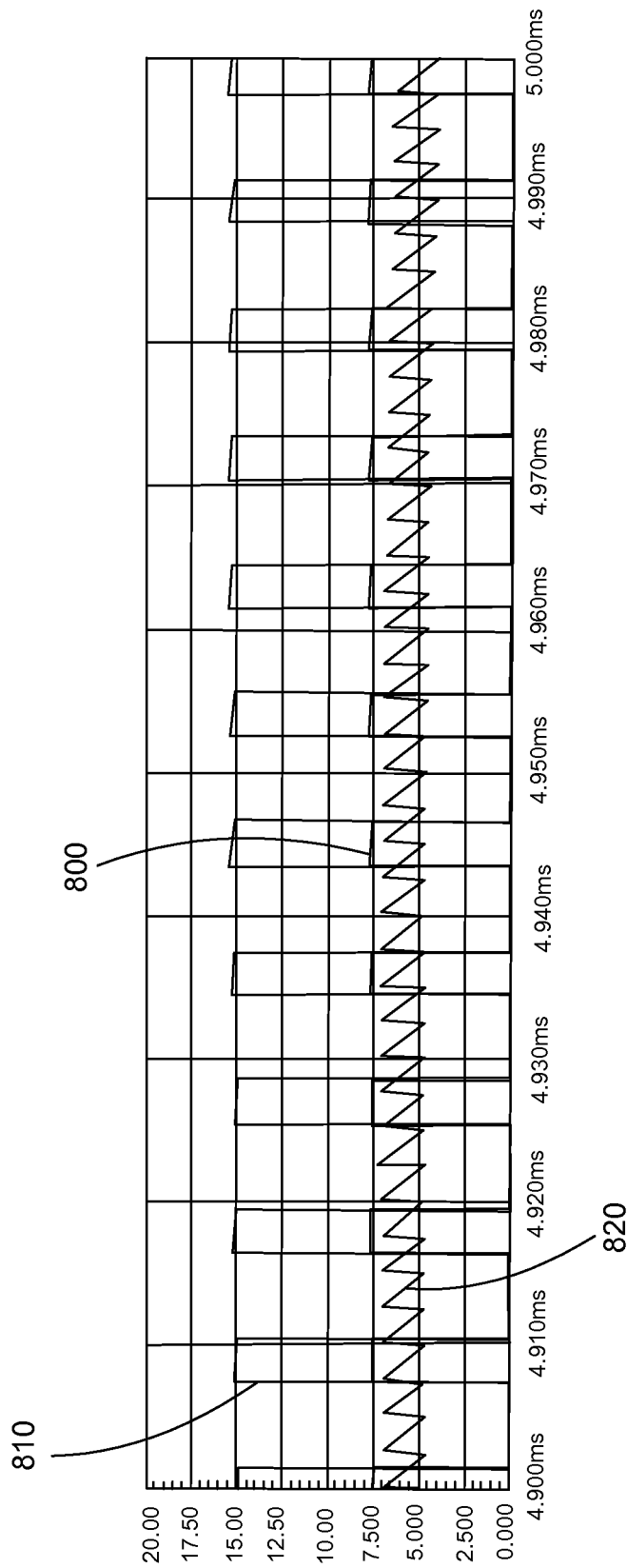
FIG. 8 is a graph indicating comparing the output of an example embodiment to actual processor current in dynamic mode.

FIG. 8 is a timing diagram depicting results using a voltage regulator with the following component values: L1=0.5 μH, RL=0.25 mOhm, C1=2,000 μF, R1=2 kOhm, C2=C3=1 μF, switching frequency $F_{SW}$=400 kHz and output voltage $V_{OUT}$=1.00V. The processor behavior was simulated by a load step: 0-15 A and load step frequency F=111 kHz. The gains of the current amplifiers 720, 730 and 744 are set to generate a signal at a 0.5 V/A scale.

In FIG. 8 the actual processor current 800, the $I_{OUT}$ signal 810 generated by the circuit described above with reference to FIG. 7 and the $I_{MON}$ signal 820 generated by the conventional inductor current method are depicted. The $I_{OUT}$ signal 810 is directly proportional to the actual processor current 800 to very high precision. However, the conventional $I_{MON}$ saw-tooth signal is a slowly changing signal that is proportional only to the average processor current. Thus, the $I_{OUT}$ signal provides a true representation of the processor current in both static and dynamic mode. Operation of these current sense components in a switching regulator supplying power to a different type of load (for example memory VR) or in a multiphase buck regulator configuration is similar to the single phase configuration shown in FIG. 7. It will be understood by those of skill in the art and will therefore not be discussed further herein.

Figure 9:
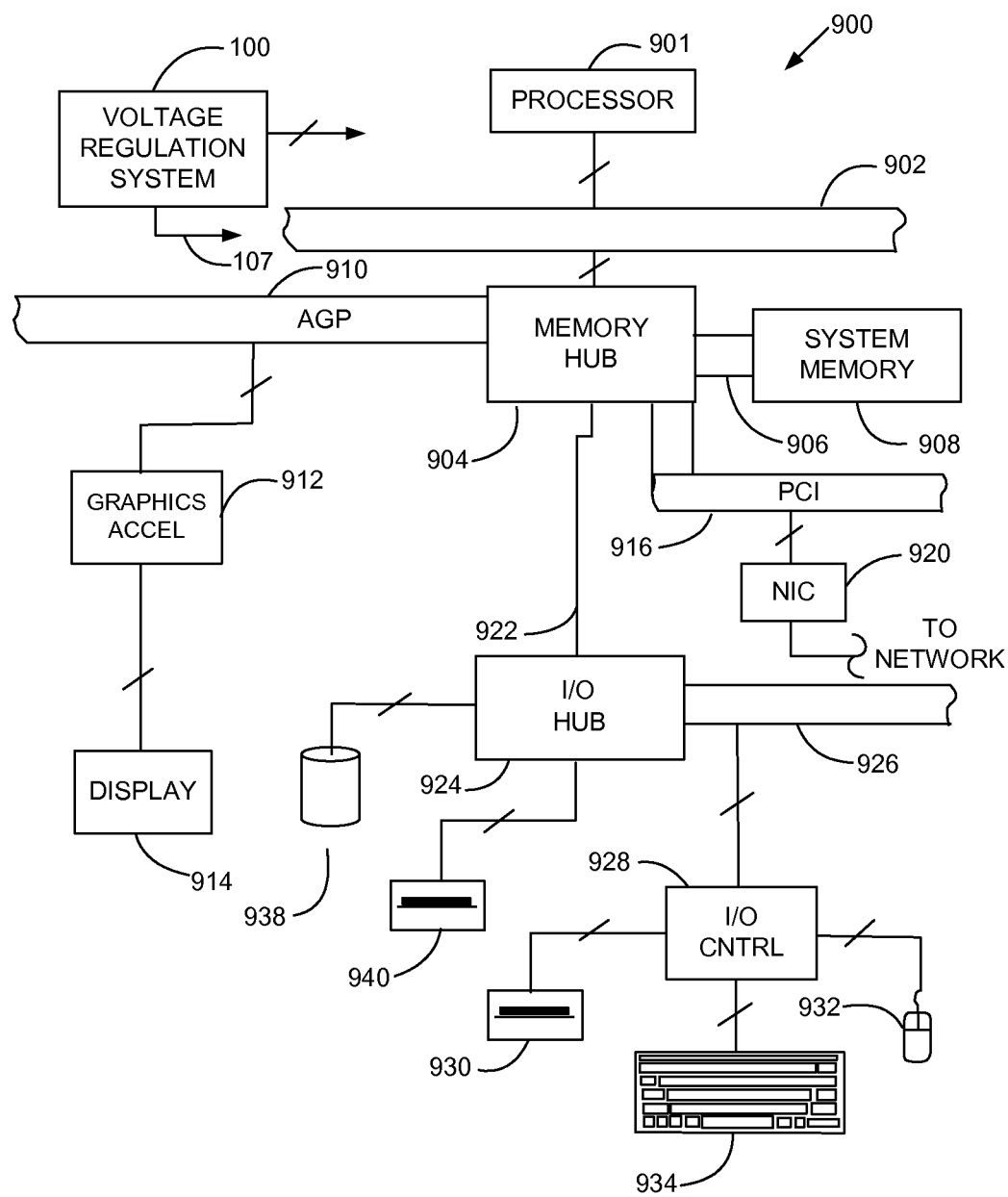
FIG. 9 is a block diagram of system including a voltage regulator.

Referring to FIG. 9, in some embodiments of the invention, the voltage regulation system 100 may furnish power (via one or more voltage communication lines that extend from the output terminal 107, for example) to a processor 901 and other components, such as chipsets, of a computer system 900. In this context, the term "processor" may refer to, as examples, to at least one microcontroller, X86 processor, Advanced RISC Machine (ARM) processor or Pentium processor. Other types of processors are possible and are within the scope of the following claims.

The processor 901 may be coupled to a local bus 902 along with a north bridge, or memory hub 904. The memory hub 922 may represent a collection of semiconductor devices, or a "chipset," and provide interfaces to a Peripheral Component Interconnect (PCI) bus 916 and an Accelerated Graphics Port (AGP) bus 910. The PCI Specification is available from The PCI Special Interest Group, Portland, Oreg. 97214. The AGP is described in detail in the Accelerated Graphics Port Interface Specification, Revision 1.0, published on Jul. 31, 1996, by Intel Corporation of Santa Clara, Calif.

A graphics accelerator 912 may be coupled to the AGP bus 910 and provide signals to drive a display 914. The PCI bus 916 may be coupled to a network interface card (NIC) 920, for example. The memory hub 904 may also provide an interface to a memory bus 906 that is coupled to a system memory 908.

A south bridge, or input/output (I/O) hub 924, may be coupled to the memory hub 904 via a hub link 922. The I/O hub 924 represents a collection of semiconductor devices, or a chip set, and provides interfaces for a hard disk drive 938, a CD-ROM drive 940 and an I/O expansion bus 926, as just a few examples. An I/O controller 928 may be coupled to the I/O expansion bus 926 to receive input data from a mouse 932 and a keyboard 934. The I/O controller 928 may also control operations of a floppy disk drive 930.

Figure 10:
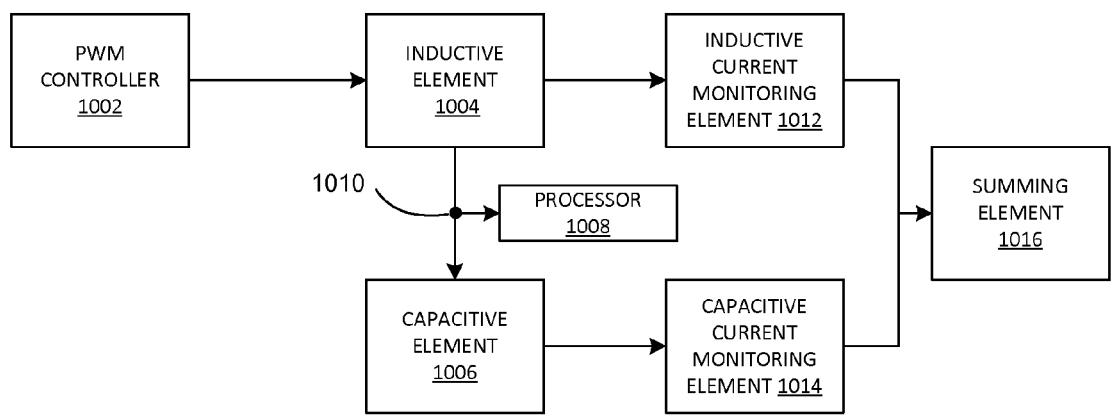
FIG. 10 is a block diagram of an example embodiment.

FIG. 10 depicts an example embodiment including a switching regulator 1000 that includes a PWM controller 1002, an inductive element 1004 and a capacitive element 1006 coupled in series. A processor 1008 is coupled to a node 1010 between the inductive and capacitive elements 1004 and 1006. The processor current is the sum of the currents provided by the inductive element and the capacitive elements 1004 and 1006.

An inductive element current monitoring circuit 1012 is coupled to the inductive element 1004 and outputs a first signal indicating the magnitude of inductor current. A capacitive element monitoring circuit 1014 is coupled to the capacitive element 1006 and outputs a second signal indicating the magnitude of capacitor current. The first and second signals are received at the inputs of a summing element 1016 which output a processor current monitoring signal indicating the sum of the inductor and capacitor currents and precisely monitors the processor current.

Although the present invention has been described in connection with specific exemplary embodiments, it should be understood that various changes, substitutions, and alterations apparent to those skilled in the art can be made to the disclosed embodiments without departing from the spirit and scope of the invention as set forth in the appended claims.

What is claimed is:

1. A method comprising:
sensing a magnitude of a current flowing through an inductor included in an LC filter of a switching voltage regulator, with the switching voltage regulator configured to supply an output current to a processor, with the LC filter having an inductor and a capacitor coupled in series;
sensing a magnitude of a current flowing through the capacitor;
adding the magnitudes of the currents flowing through the inductor and capacitor to form a current monitor signal; and
outputting the current monitor signal indicative of a magnitude of the output current.

2. The method of claim 1 further comprising:
outputting a first signal having an amplitude indicating the magnitude of the current flowing through the inductor.

3. The method of claim 2 further comprising:
outputting a second signal having an amplitude indicating the magnitude of the current flowing through the capacitor.

4. The method of claim 3 further comprising:
adjusting the amplitudes of the first and second signals to the same scale.

5. The method of claim 4 further comprising:
adding adjusted first and second signals to generate the current monitor signal.

6. A system comprising:
means for sensing a magnitude of a current flowing through an inductor, included in an LC filter of a switching voltage regulator, with the switching voltage regulator configured to supply an output current to a processor, with the LC filter having an inductor and a capacitor coupled in series;
means for sensing a magnitude of a current flowing through the capacitor;
means for adding the magnitudes of the currents flowing through the inductor and capacitor to form a current monitor signal; and
outputting the current monitor signal indicative of a magnitude of the output current.

7. The system of claim 6 further comprising:
means for outputting a first signal having an amplitude indicating the magnitude of the current flowing through the inductor.

8. The system of claim 7 further comprising:
means for outputting a second signal having an amplitude indicating the magnitude of the current flowing through the capacitor.

9. The system of claim 8 further comprising:
means for adjusting the amplitudes of the first and second signals to the same scale.

10. The system of claim 9 further comprising:
means for adding adjusted first and second signals to generate the current monitor signal.

11. A system comprising:
a chipset; and
a switching power supply, including an LC filter having an inductor and a capacitor connected in series, with the switching power supply coupled to the chipset to supply an output current to the chipset and where the switching power supply outputs a current monitor signal indicating a sum of magnitudes of currents flowing through both the inductor and the capacitor to indicate a magnitude of the output current.

12. The system of claim 11 wherein the chipset is associated with at least one of: (i) a memory hub, (ii) a Peripheral Component Interconnect bus, or (ii) an Accelerated Graphics Port bus.

13. The system of claim 11, wherein a first signal having an amplitude indicating the magnitude of the current flowing through the inductor is generated.

14. The system of claim 13, wherein a second signal having an amplitude indicating the magnitude of the current flowing through the capacitor is generated.

15. The system of claim 14, wherein the amplitudes of the first and second signals are adjusted to the same scale.

16. The system of claim 15, wherein the adjusted first and second signals are added to generate the current monitor signal.

* * * * *